United States Patent
Hessinger et al.

(10) Patent No.: US 9,437,506 B2
(45) Date of Patent: Sep. 6, 2016

(54) SEMICONDUCTOR DEFECT CHARACTERIZATION

(71) Applicant: Lattice Semiconductor Corporation, Hillsboro, OR (US)

(72) Inventors: Uwe Hessinger, Portland, OR (US); Brett Schafman, Portland, OR (US); Wendy Chan, Portland, OR (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/271,331

(22) Filed: May 6, 2014

(65) Prior Publication Data

US 2014/0335631 A1 Nov. 13, 2014

Related U.S. Application Data

(60) Provisional application No. 61/821,815, filed on May 10, 2013.

(51) Int. Cl.
*G06F 17/50* (2006.01)
*H01L 21/66* (2006.01)

(52) U.S. Cl.
CPC .............. *H01L 22/20* (2013.01); *H01L 22/12* (2013.01); *H01L 22/14* (2013.01)

(58) Field of Classification Search
USPC ........................................................ 716/136
See application file for complete search history.

(56) References Cited

U.S. PATENT DOCUMENTS

| | | | |
|---|---|---|---|
| 5,971,586 A | 10/1999 | Mori | |
| 2002/0032888 A1* | 3/2002 | Ott | H01L 22/20 714/724 |
| 2002/0173872 A1* | 11/2002 | Malik | B24B 37/04 700/164 |
| 2003/0120445 A1* | 6/2003 | Barbour | G06F 17/18 702/81 |
| 2003/0151422 A1* | 8/2003 | Barnett | G06F 17/18 324/750.05 |
| 2007/0212798 A1* | 9/2007 | Deshmukh | H01L 21/67288 438/5 |
| 2008/0294281 A1* | 11/2008 | Shimshi | G05B 19/41875 700/110 |
| 2009/0265155 A1* | 10/2009 | Yokogawa | G06F 17/5081 703/14 |
| 2013/0197875 A1* | 8/2013 | Shirley | G01R 31/31718 703/2 |

OTHER PUBLICATIONS

Hessinger, Uwe, et al., "Statistical Correlation of Inline Defect to Sort Test in Semiconductor Manufacturing", Advanced Semiconductor Manufacturing Conference (ASMC), 2013 24th Annual SEMI, May 14-16, 2013, pp. 212-219, IEEE, Saratoga Springs, NY.
Baron, Michael, et al., "Modeling and Forecasting of Defect—Limited Yield in Semiconductor Manufacturing", IEEE Transactions on Semiconductor Manufacturing, vol. 21, No. 4, Nov. 2008, pp. 614-624.
Mori, Kiyoshi, et al., "Yield Improvement Proceductes for Particle Defects", Proceedings of the 4th Annual International Conference on Industrial Engineering Theory, Applications and Practice, Nov. 17-20, 1999, San Antonio, Texas, pp. 1-8.

(Continued)

*Primary Examiner* — Mohammed Alam

(57) ABSTRACT

The defect-containing die identified from an inspection layer analysis subsequent to a manufacturing step for a wafer including a plurality of die and as well as the faulty die identified from a fault testing of the wafer are processed to identify a subset of the die that both contain a defect and are faulty. A probability analysis is performed to determine a confidence level of whether the die in the subset are faulty due to their defects.

18 Claims, 4 Drawing Sheets

(56) References Cited

OTHER PUBLICATIONS

Nurani, Raman K., et al., "In-Line Defect Sampling Methodology in Yield Management: An Integrated Framework", IEEE Transactions on Semiconductor Manufacturing, vol. 9, No. 4, Nov. 1996, pp. 506-517.

Ooi, Melanie Po-Leen, "Fast and Accurate Automatic Defect Cluster Extraction for Semiconductor Wafers", 2010 Fifth IEEE International Symposium on Electronic Design, Test & Applications, 2010, IEEE, pp. 276-280.

Riley, Stuart L., "Limitations to Estimating Yield Based on In-Line Defect Measurements", International Symposium on Defect and Fault Tolerance in VLSI Systems, DFT '99, 1999, pp. 46-54, Albuquerque, NM.

Walsh, Brian, et al., "45nm Yield Model Optimization", 2011 $22^{nd}$ Annual IEEE/SEMIS Advanced Semiconductor Manufacturing Conference (ASMC), May 16-18, 2011, pp. 1-4, Saratoga Springs, NY.

* cited by examiner

SEMICONDUCTOR DEFECT CHARACTERIZATION

RELATED APPLICATION

This application claims the benefit of U.S. Provisional Application No. 61/821,815, filed May 10, 2013, the contents of which are hereby incorporated by reference in their entirety.

TECHNICAL FIELD

The present disclosure relates generally to semiconductors, and more particularly to the correlation of semiconductor defects with die faults.

BACKGROUND

Manufacture of modern integrated circuits is remarkably complex and involves hundreds of individual steps. The cleanliness and precision of each of the hundreds of steps is typically critical to providing a sufficiently high yield rate. A semiconductor wafer will generally be diced into hundreds if not thousands of die. Each die contains numerous transistors and other devices. Inevitably, flaws or errors introduce faults in some of the die so that they are rejected. The testing of the die can occur prior to dicing so that the bad circuits that are identified may be discarded prior to packaging.

To monitor such a complex process, it is conventional to implement a plurality of "inspection layers." In that regard, semiconductor manufacture involves many individual steps as mentioned above. For example, a modern CMOS die may include eight or more metal layers. The metal layers are patterned to form traces or leads that carry the signaling between the die's transistors, power and ground, as well as for communication with external devices. The metal layers, which are insulated by intervening dielectric layers, are coupled together through vias that extend through the dielectric layers. The formations of the metal layers and vias are typically followed by corresponding inspection steps. The patterned metal layers and vias are imaged using a variety of means such as laser imaging, visible light cameras, infrared cameras, and so on. The resulting images are then processed with machine vision to identify flaws or defects. The combination of the imaging and image processing forms an "inspection layer." There may be many inspection layers during the course of manufacturing. One can well appreciate that they need not be limited to the construction of the various metal layers and vias but also with regard to the photolithographic and other steps that occur during patterning, implantation, and diffusion of the active devices into the semiconductor substrate.

The inspection layers present a wealth of data that may be mined to identify "troublesome" or dispositive defects. In that regard, a defect identified in an inspection layer may be innocuous such that the resulting integrated circuit is still functional despite the flaw identified in the inspection layer. For example, a line formed in a metal layer may deviate undesirably but not sufficiently to short or cause other issues that result in malfunction. Thus, it is known to correlate flaws identified in the inspection layers with the fault testing of the die. Those flaws that correlate strongly with faults thus point to problems in the corresponding manufacturing step. Wafer manufacturing is quite expensive so that adjustments made that result in better yield may provide dramatic cost savings for a semiconductor manufacturer. However, current attempts at correlating inspection layer defects have not employed statistics and the use of confidence to extract likely cases of defects causing die failure. For example, conventional analyses fail to consider the absolute scale of numbers, which has a strong impact on statistics and confidence. In that regard, a given wafer may have a certain number of dies that fail. The same wafer has a number of die with identified defects. For example, suppose that the die with identified defects constitute 10% of the total number of die on the wafer and that percentage of failed die also constitutes 10% of the total number of die on the wafer. If the defects are entirely random without correlation to the failure, one would expect that the total number of failed die with defects would be 10% of 10% of the total number of die on the wafer. In other words, one would expect 1% of the total number of die to be both failing die and defect-containing die in such a purely random case. But it may be the case that the defect distribution is correlated with the failing die distribution. Conventional die defect analysis techniques do not use statistics to distinguish between such random defect distributions and dispositive defect distributions.

Accordingly, there is a need in the art for improved inspection layer correlation techniques.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
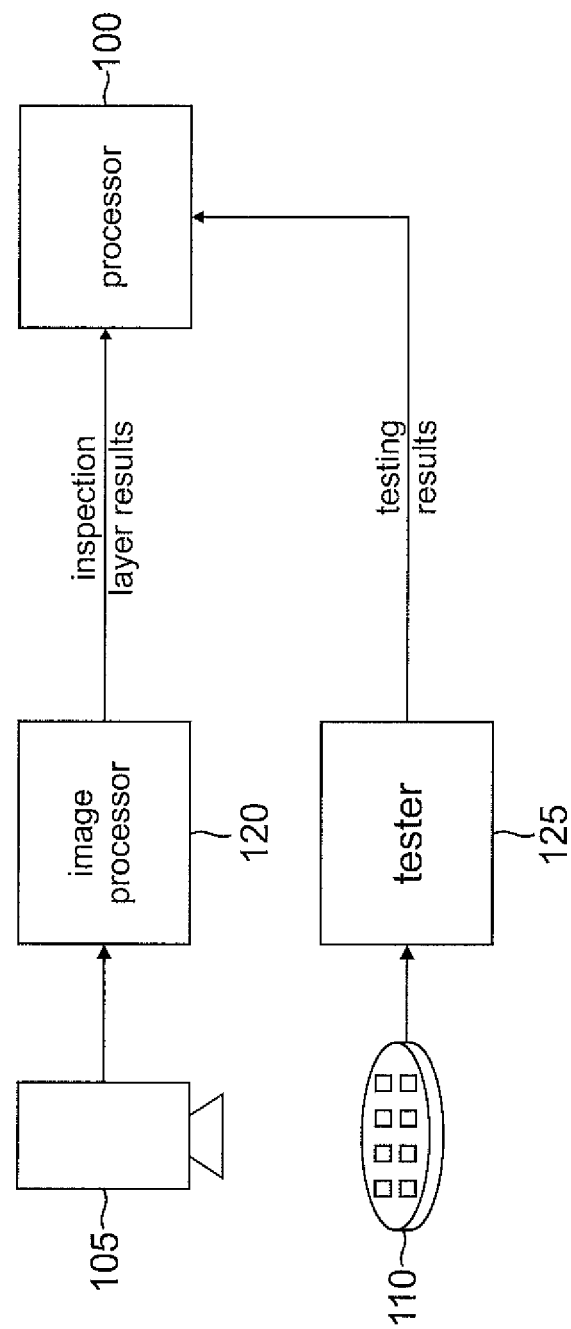
FIG. 1 is a diagram of an example inspection layer correlation processor and its relationship to the gathering of the inspection layer data and the pass/fail test data.

Turning now to the drawings, FIG. 1 shows an example inspection layer correlation processor 100. It will be appreciated that processor 100 may comprise one or more computers. The type of processor used to implement the advantageous inspection layer correlation techniques disclosed herein is not critical—what is needed is merely a programmable machine that can implement the desired correlation algorithm. As shown in FIG. 1, a separate semiconductor inspection tool such as a camera 105 images the desired inspection layers. As used herein, an "inspection layer" refers to anomalies or defects detected in a single wafer inspection step at various stages during the manufacture of dies on a wafer 110. For example, one inspection layer may follow the formation and patterning of the M1 metal layer, another inspection layer may follow the formation of the vias to the M1 metal layer, and so on. Camera 105 sends its image information to an inspection layer processor 120 that processes the image information to identify flaws or defects and their die location on the wafer. Processor 100 receives the resulting inspection layer data, which comprises the identity of the inspection layer and the location of the identified flaws or defects on the wafer. The wafer is then processed using a tester 125 to identify faulty die. Die that are not identified as faulty operate properly as tested by tester 125. Processor 100 receives the test pass/no pass die data from tester 125 in addition to the inspection layer data discussed above. Processor 100 implements an advantageous correlation algorithm on the inspection layer data and testing data, which is discussed as follows.

The Correlation Algorithm

Figure 2:
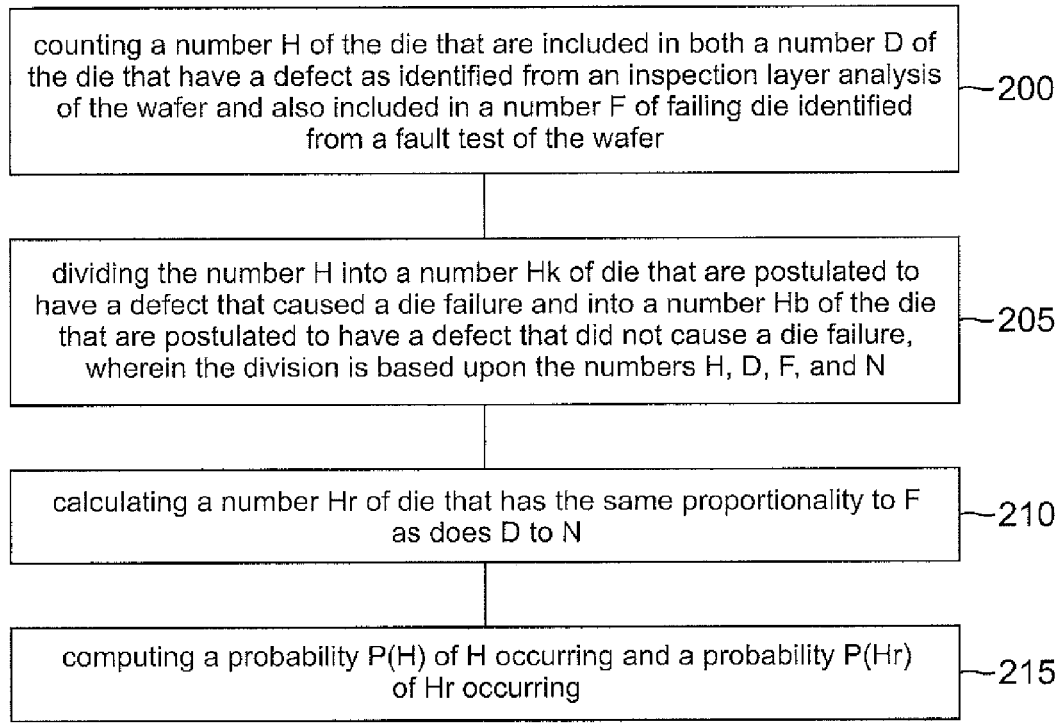
FIG. 2 is a flowchart for an example inspection layer correlation algorithm.
Figure 3:
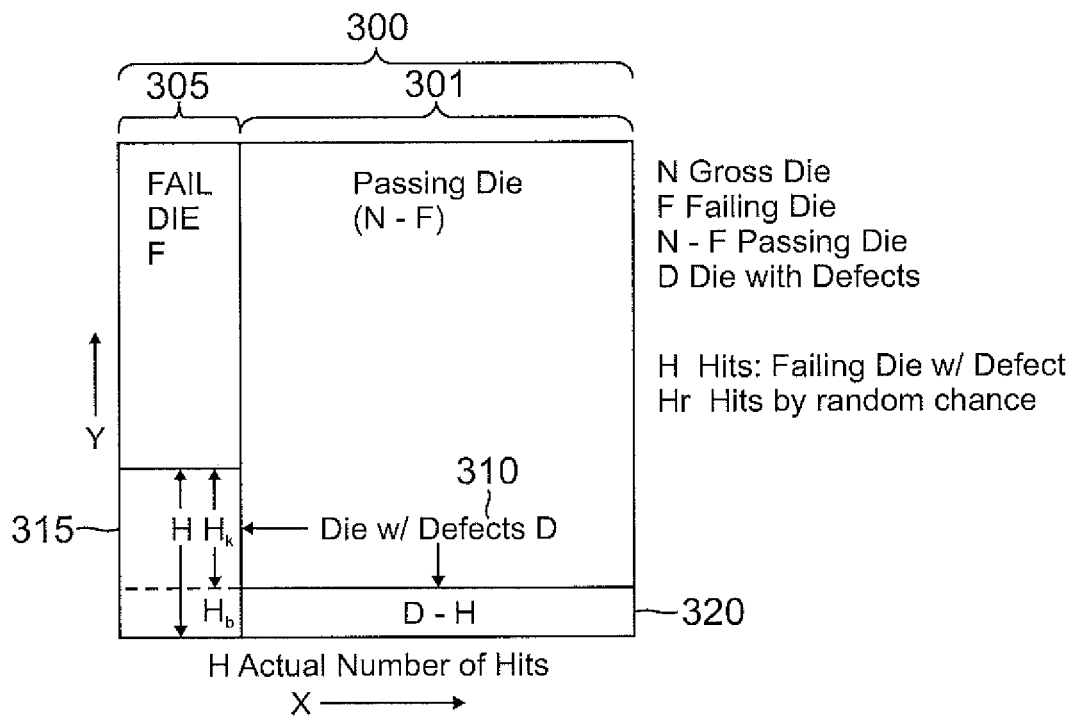
FIG. 3 is a diagram in which an example set of dies are classified according to an inspection layer's defects and the die testing, wherein the defects are assumed to have some correlation with the die failures.

The algorithm comprises a number of steps as shown in the flowchart of FIG. 2. A first step 200 comprises classifying the die according to each inspection layer analysis and the testing results. This classification (which may also be thought of as an alignment) is shown symbolically in FIG. 3 for a representative inspection layer with regard to a square 300 representing the total die per wafer or sample. The total number of dies on the wafer may be represented by a variable N, which also represents the area of square 300 as defined with respect to an X axis and Y axis. The passing and failing die are distinguished with regard to the X axis. With reference to the X axis, a subset 305 defines the number F of the failing die. Subset 305 is delimited by a vertical line extending across the Y dimension that divides the total area N from failing portion 305. A remaining subset 301 within square 300 to the right of set 305 in the X dimension represent the number of passing die, which must equal (N−F) from the definition of N and F.

The Y dimension for square 300 is used to distinguish between the defect-containing die and non-defect-containing die. A variable H represents the number of die that both failed and contain a defect, whereas a variable D represents the total number of die that contain a defect regardless of whether they passed or failed. Given this definition for the number H, the number of die that have a defect but passed must of course be represented by a number (D−H). A horizontal line at the Y dimension of (D−H) in square 300 represents a subset 320 of the (D−H) die that passed but have a defect. One can thus appreciate that a subset 310, which contains the D die that have a defect and either passed or failed, has a "right-angled" shape in the X and Y dimensions. In other words, an H subset 315 of the D has an area which represents the number of die both failing and having a defect. A remaining portion of D, which is a subset 320 for the (D−H) die that have defects but are passing, extends from F in the X dimension and has an area of (D−H).

Referring again to FIG. 1, it will be appreciated that the numbers N, D, and F are known prior to the correlation algorithm being implemented on processor 100. In particular, the number D comes from the inspection layer analysis whereas F comes from the failure testing. Step 200 in the correlation algorithm implemented by processor 100 thus identifies the problematic defects from the die classified into the N, D, and F subsets. In particular, step 200 identifies and counts the H die in subset 315 in addition to the N, D, and F subsets. The method continues with a step 205 of further classifying the set H into the fraction of die whose defect is deemed to have caused the die's failure versus the fraction of die whose defect is deemed to not have caused the corresponding failure. A Set Hb comprises the total number of die in set H that have benign defects—in other words, those die in set H that failed but whose defect was not the cause of the failure. Finally, a set Hk comprise the number of die in set H that correspond to problematic defects, which is to say defects that caused the resulting failure of the die. The division of subset H between the two subsets is represented by a dashed line in subset 315 of FIG. 3. Note the proportionality of the set (D−H) to the total number of die that passed, which is (N−F). The benign set Hb is assumed to have this same proportionality with regard to the set F such that a ratio of Hb/F equals the ratio of (D−H)/(N−F). Algebraic manipulation of this equality leads to a definition of Hk as the ratio (H*N−F*D)/(N−F). The ratio of problematic hits Hk to the number of defects D is thus given by the ratio (H*N−F*D)/(D*(N−F)). Steps 200 and 205 are repeated for all the remaining inspection layers.

Figure 4:
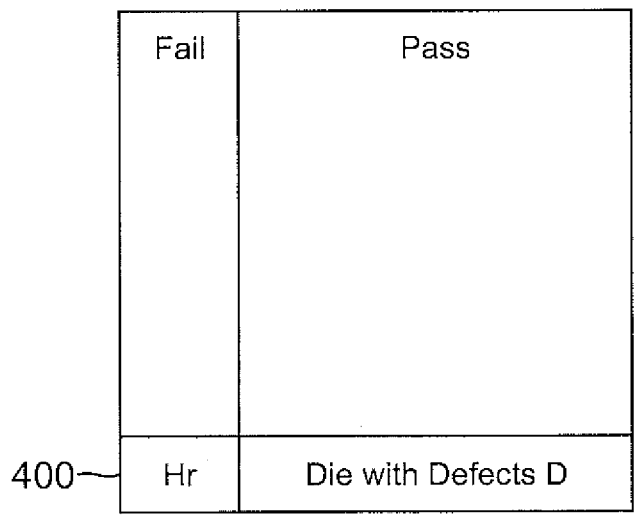
FIG. 4 is a diagram in which an example set of dies are classified according to an inspection layers defects and the die testing, wherein the defects are assumed to have a random relationship to the die failures.

The preceding discussion assumes one can classify the number of hits H into the subsets Hk and Hb with some confidence. However, there exists the possibility that the set of hits H is due to random chance alone. FIG. 4 illustrates the resulting distribution for a set N of die, which is divided into the F and (N−F) sets as discussed with regard to FIG. 3. A set 400 represents the number Hr of hits—as discussed above, "hits" are dies with defects that also belong to the class F of failing die. But in contrast to set H of FIG. 3, the hits in Hr result from randomness as opposed to a correlation between defect distribution in set N and the failing die distribution in set N. Since the die in Hr occur purely due to randomness, the number of Hr flows from the proportionality of the set D of die with defects to the overall number of die N. In other words, Hr is to the set F as the set D is to N (i.e., Hr/F=D/N). Hr thus equals (F*D)/N. The method of FIG. 2 includes a step 210 of calculating the number Hr accordingly. The probability that Hr occurs (represented as P(Hr)) may be determined from a hypergeometric distribution that is a function f(F*D/N, F, D, N). Similarly, the probability that H occurs (represented as P(H)) is given by the hypergeometric function f(H, F, D, N).

A hypergeometric function gives the probability for n random draws delivering k successes from a finite population N divided into two groups K and (N−K). With regard to the probability P(H), it can be shown that the hypergeometric function gives the probability as (F!/(H!*(F−H)!))*((N−F)!/((D−H)!*(N−F−D+H)!))/(N!/(D!*(N−D)!) ), where ! is the factorial symbol. An analogous expression defines the probability P(Hr). Given the two probabilities, one can then calculate the confidence factor CF, which equals the log of the ratio of P(Hr)−P(H). In this example, we will assume that the base for the log function is 10 but other bases such as Euler's number e may be used as well.

Referring again to the flowchart of FIG. 2, the method thus includes a step of 215 of determining the probabilities P(Hr) and P(H) for each inspection layer. Given the calculation of these probabilities, the sets Hk may now be adjusted responsive to the confidence factor CF to provide confidence-factor-adjusted sets Hk', where Hk' for each inspection layer equals Hk*(P(Hr)−P(H))/P(Hr). The scaling factor (P(Hr)−P(H))/P(Hr) may be designated as $f_{CF}$, which can be shown to equal $1-10^{-CF}$ (assuming that CF was calculated with a base-10 logarithm). The scaling factor $f_{CF}$ may be used to calculate a confidence-factor-adjusted yield (Y_absolute), which equals $f_{CF}$*Hk/N. A relative yield factor (Y_relative), which is calculated with regard to the failing class F rather than the class N of all die, equals $f_{CF}$*Hk/F.

The confidence-factor-adjusted yields are very useful in spotting problems in process steps corresponding to the various inspection layers. Should an inspection layer have an anomalous confidence-factor-adjusted yield, the corresponding wafer manufacturing process step may be examined further to identify the cause of the dispositive defects that have been identified so that the step may be adjusted accordingly to reduce the defects. The resulting calculations are quite advantageous. For example, the classifications of the set N of die for a wafer into the sets such as H and F is a routine matter for a processor such as processor 100 of FIG. 1. Moreover, the calculation of the factorials and ratios for the probabilities P(Hr) and P(H) as well as the confidence-adjusted set Hk' for the various inspection layers is also a routine exercise for processor 100. The resulting algorithm is thus quite robust as it is presents relatively little computation burden and is thus fast yet accurately identifies sets Hk', which represent the dispositive defects. In other words, defects in set Hk' may be deemed to have caused the corresponding die failure with a large degree of confidence. In contrast, the prior art die defect analysis algorithms provided no such confidence.

Figure 5:
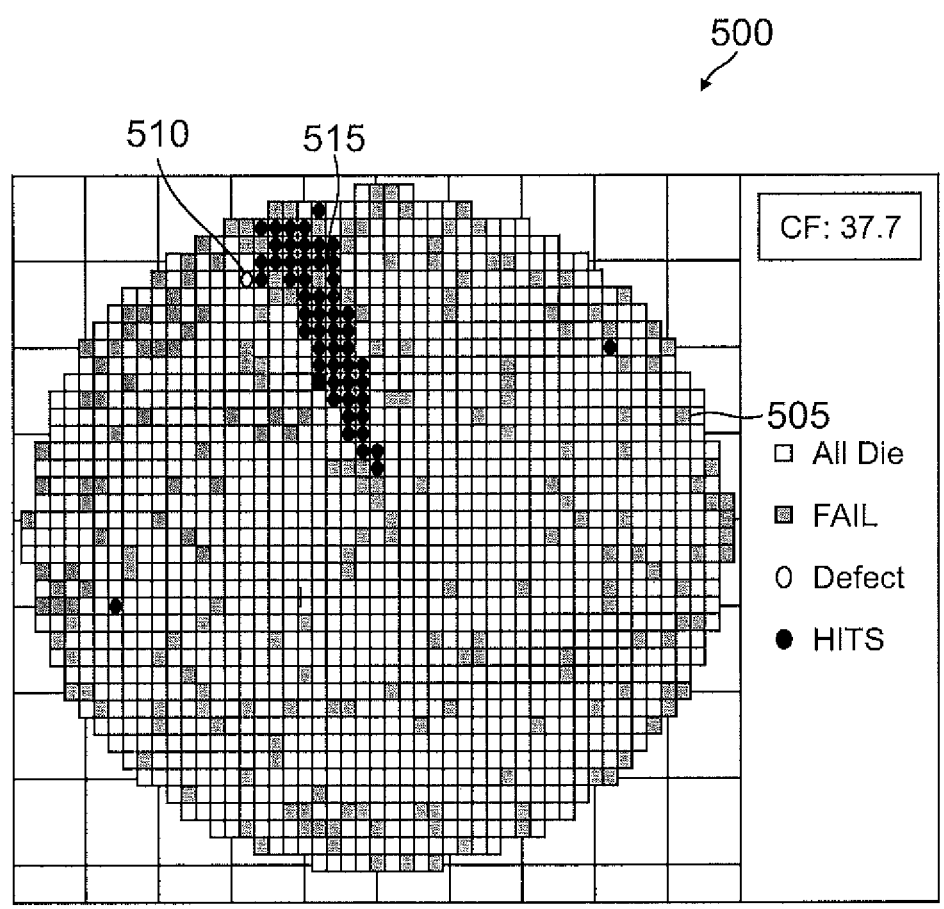
FIG. 5 is an example wafer map corresponding to an inspection layer associated with a relatively-high confidence factor.

Depending upon one's familiarity with a process step, the confidence-factor-adjusted yields alone for a given inspection layer may be enough to identify or highlight a problem in the process step. To provide further aid to the identification of problematic foundry process steps, a wafer map may be prepared for those inspection layers with sufficiently high confidence factors—e.g., those inspection layers having a confidence factor of 1 or greater. An example wafer map 500 is shown in FIG. 5. Failed die 505 are shown by square symbols whereas defects 510 are shown by circular symbols. The overlap of a circle onto a square represents a hit 515, which is a die that has both failed and contains a defect. The confidence factor of 37 for this wafer map is quite high. The clustering of hits 515 is thus highly indicative of a systemic error in the corresponding wafer processing step. Such an identification is quite advantageous because it is expensive to perform a fault analysis on a given process step and investigate the root cause of the defective die. But using the confidence factor as disclosed herein allows one to select with relative certainty those inspection layers in which the defects and failures are correlated.

The determination of the confidence factor has a number of advantages. For example, there are many different yield loss modes of interest for wafer processing and yield enhancement. One type of yield loss may stem from a baseline defect that affects all wafers. Alternatively, a unique yield loss mechanism may only affect particular wafers (denoted herein as excursion wafers). A wafer with an inspection layer having a confidence factor excursion of a relatively high value is indicative of an outlier and its cause. The confidence factor thus enables such a speedy identification of outlier wafers and their fault cause so that resource-intensive efforts such as a physical failure analysis (PFA) can instead be focused on errors of unknown causes.

The above-described statistical analysis of the inspection layers for a single wafer may be combined with corresponding analyses of other wafers in a wafer manufacturing batch or lot. Although individual wafer statistics are then sacrificed into a group representation, the statistical confidence of the resulting wafer overlay is enhanced. Analyzing over a batch of wafers is an especially powerful tool in a mature production line where comparing different equipment or process treatments returns low level but important yield improvements.

It will be appreciated that the techniques and concepts discussed herein are not limited to the specific disclosed embodiments. The appended claims encompass all such changes and modifications as fall within the true spirit and scope of this invention.

We claim:

1. A method of semiconductor manufacture, comprising:
   in a computer for analyzing a wafer having a number of die (N), counting a number (H) of the die that are included in both a subset of the N die, with a number (D) members, having a defect, as identified from an inspection layer analysis of the wafer, and which also are included in a subset of the N die, which are failing, having a number of failing die (F) identified from a fault test of the wafer;
   in the computer, dividing H into a number (Hk) of die that are postulated to have a defect that caused a die failure and into a number (Hb) of the die that are postulated to have a defect that did not cause a die failure, wherein the division is based upon the numbers H, D, F, and N, and H=Hk+Hb;
   in the computer, calculating a number (Hr) of die that has the same proportionality to F as does D to N;
   in the computer, computing a probability (P(H)) of H occurring and a probability (P(Hr)) of Hr occurring; and
   adjusting a wafer manufacturing step based at least on P(H) and P(Hr).

2. The method of claim 1, further comprising:
   in the computer, computing a confidence factor based upon a ratio of P(H) and P(Hr).

3. The method of claim 2, wherein computing the confidence factor is further based upon a logarithm of the ratio.

4. The method of claim 2, further comprising: in the computer, calculating a confidence-factor-adjusted yield based upon the confidence factor and Hk.

5. The method of claim 4, wherein the calculation of the confidence-factor-adjusted yield is further based upon N.

6. The method of claim 2, further comprising repeating the counting, dividing, and computing steps for additional inspection layers for the wafer.

7. The method of claim 6, further comprising identifying the inspection layers that have confidence factors greater than a threshold.

8. The method of claim 7, wherein the threshold is at one or greater.

9. The method of claim 7, further comprising analyzing a wafer map for each of the identified inspection layers, wherein each wafer map classifies the die according to the corresponding inspection layer analysis and fault testing.

10. The method of claim 9, further comprising adjusting the wafer manufacturing process step based upon the confidence-factor-adjusted yield.

11. The method of claim 1, wherein computing the probability P(H) comprises using a hypergeometric function.

12. The method of claim 9, wherein the hypergeometric function equals (F!/(H!*(F−H)!))*((N−F)!/((D−H)!*(N−F−D+H)!))/(N!/(D!*(N−D)!)).

13. The method of claim 1, wherein computing the probability P(Hr) comprises using a hypergeometric function.

14. A system, comprising:
a computer configured to:
count a number (H) of the die on a wafer that are included in both a number D of die on the wafer that have a defect as identified from an inspection layer analysis and included in a number (F) of failing die on the wafer identified from a fault test;
divide the number H into a number (Hk) of die that are postulated to have a defect that caused a die failure and into a number (Hb) of the die that are postulated to have a defect that did not cause a die failure, wherein the division is based upon the numbers H, D, F, and N;
calculate a number (Hr) of die that has the same proportionality to F as the proportionality of D to N; and
compute a probability (P(H)) of H occurring and a probability (P(Hr)) of Hr occurring.

15. The system of claim 14, wherein the computer is further configured to compute a confidence factor based upon a ratio between P(H) and P(Hr).

16. The system of claim 15, wherein the computer is further configured to compute the confidence factor based upon a logarithm of the ratio.

17. The system of claim 14, wherein the computer is further configured to repeat the counting, dividing, and computing steps for additional inspection layers for the wafer.

18. The method of claim 1, further comprising:
subsequent to a manufacturing step for a wafer having a number N of die;
performing an inspection analysis to identify the number D of die on the wafer with a defect; and
subsequent to a completion of the manufacturing of the die on the wafer, testing an operability of the die to identify the number F of the die that failed the testing.

* * * * *